US006825422B2

(12) United States Patent
Eldridge et al.

(10) Patent No.: US 6,825,422 B2
(45) Date of Patent: Nov. 30, 2004

(54) INTERCONNECTION ELEMENT WITH CONTACT BLADE

(75) Inventors: Benjamin N. Eldridge, Danville, CA (US); Gary W. Grube, Pleasanton, CA (US); Igor Y. Khandros, Orinda, CA (US); Alec Madsen, San Francisco, CA (US); Gaetan L. Mathieu, Livermore, CA (US)

(73) Assignee: Formfactor, Inc., Livermore, CA (US)

( * ) Notice: Subject to any disclaimer, the term of this patent is extended or adjusted under 35 U.S.C. 154(b) by 0 days.

(21) Appl. No.: 10/174,455

(22) Filed: Jun. 17, 2002

(65) Prior Publication Data

US 2003/0015347 A1 Jan. 23, 2003

Related U.S. Application Data

(63) Continuation of application No. 09/189,761, filed on Nov. 10, 1998, now Pat. No. 6,441,315.

(51) Int. Cl.[7] .................................................. H05K 1/16
(52) U.S. Cl. ...................... 174/260; 174/267; 361/772; 361/776; 439/81
(58) Field of Search ................................ 174/260, 267; 361/760, 769, 772, 773, 774, 776; 257/785, 780; 438/117; 439/81, 66, 83, 862

(56) References Cited

U.S. PATENT DOCUMENTS 3,881,799 A    5/1975   Elliott et al.

(List continued on next page.)

FOREIGN PATENT DOCUMENTS

| FR | 2587549 | 3/1987 |
|----|---------|--------|
| JP | 60-10298 B | 4/1985 |
| JP | 6119770 | 2/1986 |
| JP | 62-158778 A | 10/1987 |
| JP | 62160373 | 10/1987 |
| JP | 63-48063 B | 12/1988 |
| JP | 4214650 | 8/1992 |
| JP | 618555 | 1/1994 |
| JP | 7333232 | 12/1995 |
| JP | 8-78110 A | 3/1996 |
| TW | 341747 | 10/1998 |
| WO | WO 96/37332 | 11/1996 |
| WO | WO 9743653 | 11/1997 |
| WO | WO 9744676 | 11/1997 |
| WO | WO 9852224 | 11/1998 |

OTHER PUBLICATIONS

Kong et al., "Integrated Electrostatically Resonant Scan Tip for an Atomic Force Microscope," Journal of Vacuum Science & Technology, vol. B 11(3) No. 3, pp. 634–641 (May/June 1993).

Leung et al., "Active Substrate Membrane Probe Card," Technical Digest of the International Electron Devices Meeting (IEDM) (Oct. 12, 1995), pp. 709–712.

*Primary Examiner*—David A. Zarneke
*Assistant Examiner*—J B Patel
(74) *Attorney, Agent, or Firm*—N. Kenneth Buraston; Stuart L. Merkadeau

(57) ABSTRACT

An apparatus and method providing improved interconnection elements and tip structures for effecting pressure connections between terminals of electronic components is described. The tip structure of the present invention has a sharpened blade oriented on the upper surface of the tip structure such that the length of the blade is substantially parallel to the direction of horizontal movement of the tip structure as the tip structure deflects across the terminal of an electronic component. In this manner, the sharpened substantially parallel oriented blade slices cleanly through any non-conductive layer(s) on the surface of the terminal and provides a reliable electrical connection between the interconnection element and the terminal of the electrical component.

22 Claims, 7 Drawing Sheets

U.S. PATENT DOCUMENTS

| | | |
|---|---|---|
| 4,295,184 A | 10/1981 | Roberts |
| 4,553,192 A | 11/1985 | Babuka et al. |
| 4,636,722 A | 1/1987 | Ardezzone |
| 5,090,118 A | 2/1992 | Kwon et al. |
| 5,092,782 A | 3/1992 | Beaman |
| 5,103,557 A | 4/1992 | Leedy |
| 5,109,596 A | 5/1992 | Driller et al. |
| 5,152,695 A * | 10/1992 | Grabbe et al. ................. 439/71 |
| 5,172,050 A | 12/1992 | Swapp |
| 5,177,438 A | 1/1993 | Littlebury et al. |
| 5,191,708 A | 3/1993 | Kasukabe et al. |
| 5,228,861 A | 7/1993 | Grabbe |
| 5,230,632 A | 7/1993 | Baumberger et al. |
| 5,297,967 A * | 3/1994 | Baumberger et al. ......... 439/66 |
| 5,462,440 A | 10/1995 | Rothenberger |
| 5,465,611 A | 11/1995 | Ruf et al. |
| 5,476,818 A | 12/1995 | Yanof et al. |
| 5,555,422 A | 9/1996 | Nakano |
| 5,573,435 A | 11/1996 | Grabbe et al. |
| 5,599,194 A | 2/1997 | Ozawa et al. |
| 5,625,297 A | 4/1997 | Arnaudov et al. |
| 5,632,631 A | 5/1997 | Fjelstad et al. |
| 5,723,894 A | 3/1998 | Ueno et al. |
| 5,764,486 A | 6/1998 | Dendse |
| 5,829,128 A | 11/1998 | Eldridge et al. |
| 5,917,707 A | 6/1999 | Khandros et al. |
| 5,929,521 A | 7/1999 | Wark et al. |
| 5,974,662 A | 11/1999 | Eldridge et al. |
| 5,994,152 A | 11/1999 | Khandros et al. |
| 6,002,266 A | 12/1999 | Briggs et al. |
| 6,008,982 A | 12/1999 | Smith |
| 6,031,282 A | 2/2000 | Jones et al. |
| 6,059,982 A | 5/2000 | Palagonia et al. |
| 6,110,823 A | 8/2000 | Eldridge et al. |
| 6,114,221 A | 9/2000 | Tonti et al. |
| 6,184,576 B1 * | 2/2001 | Jones et al. ................. 257/696 |
| 6,184,699 B1 | 2/2001 | Smith et al. |
| 6,219,908 B1 | 4/2001 | Farnworth et al. |

\* cited by examiner

INTERCONNECTION ELEMENT WITH CONTACT BLADE

This is a continuation application of Ser. No. 09/189,761, filed Nov. 10, 1998, now U.S. Pat. No. 6,441,315.

BACKGROUND OF THE INVENTION

1. Field of the Invention

The present invention relates generally to the field of electrical interconnection (contact) elements, and, more particularly, to interconnection elements and tip structures suitable for effecting pressure connections between electronic components.

2. Description of the Related Art

Generally, interconnections between electronic components can be classified into the two broad categories of "relatively permanent" and "readily demountable". An example of a relatively permanent connection is a solder joint. Once two electronic components are soldered to one another, a process of unsoldering must be used to separate the components. A wire bond, such as between a semiconductor die and the inner leads of a semiconductor package (or the inner ends of lead frame fingers) is another example of a relatively permanent connection.

One example is a group of rigid pins of one electronic component being received by resilient socket elements of another electronic component. The socket elements exert a contact force (pressure) on the pins in an amount sufficient to ensure a reliable electrical connection therebetween. Another type of readily demountable connection are interconnection elements (also referred to herein as springs, spring elements, spring contacts or spring contact elements) that are themselves resilient, springy, or mounted in and/or on a spring medium. An example of such a spring contact element is a needle of a probe card component. Such spring contact elements are typically intended to effect temporary pressure connections between a component to which they are mounted and terminals of another component, such as a semiconductor device under test.

Tip structures are often mounted (or affixed or coupled) to one end of an interconnection element. Tip structures provide a desired tip shape to the interconnection elements and are particularly useful in providing a small area contact with a controlled geometry that creates a repeatable high pressure. Tip structures become increasingly critical as the interconnection elements themselves become smaller and smaller. A tip structure may also have topological features on its surface to assist in providing an electrical contact between the two electrical components. For example, the purpose of the tip structure is typically to break through the non-conductive layer (often corrosion, oxidation products, or other types of contaminated films) on the terminals of the electrical component under test. As a contact force is applied, the interconnection element applies a pressure to the terminal of the electronic component under test and causes the tip structure to deflect across the terminal. This small horizontal movement of the tip structure across the surface of the corresponding terminal allows the tip structure to penetrate the nonconductive layer on the terminal, thereby establishing a good electrical contact between the two electronic components. For example, tip structure 10 mounted to interconnection element 12 (shown in FIGS. 1A and 1B) has a blade 14 that scrapes aside the non-conductive layer in order to achieve an electrical contact.

There are a number of problems associated with achieving the above-described electrical contact. First, as the terminal contact areas also get smaller, the horizontal movement of the tip structure 10 becomes an issue. Second, as the tip structure 10 is forced to deflect across the terminal (see FIG. 1B), it may also be forced down and away from the terminal causing the blade 14 of the tip structure 10 to rotate away from the terminal. The rotation of the blade 14 away from the terminal of the electronic component under test reduces the chances of the tip structure achieving a dependable electrical contact with the terminal of the electronic component. Further, as the tip structure scrapes across the non-conductive surface of the terminal in an effort to penetrate the nonconductive surface and establish a good electrical contact, stray particles and buildup often occur along the blade 14 and upper surface of the tip structure 10. This buildup may contribute to high contact resistance between the tip structure and the terminal, which may cause inaccurate voltage levels during device testing due to the voltage produced across the tip structure. The inaccurate voltage levels may cause a device to incorrectly fail, resulting in lower test yields when the contact is used in a device testing environment.

Thus, an interconnection element and tip structure that minimize buildup along the blade of the tip structure and maximize contact pressure between the tip structure and the terminal of the electronic component under test as the tip structure deflects across the surface of the terminal is desired.

SUMMARY OF THE INVENTION

An apparatus and method providing improved interconnection elements and tip structures for effecting pressure connections between terminals of electronic components is described. The tip structure of the present invention has a sharpened blade oriented on the upper surface of the tip structure such that the length of the blade is substantially parallel to the direction of horizontal movement of the tip structure as the tip structure deflects across the terminal of an electronic component. In this manner, the sharpened substantially parallel oriented blade slices cleanly through any non-conductive layer(s) on the surface of the terminal and provides a reliable electrical connection between the interconnection element and the terminal of the electrical component.

DESCRIPTION OF THE DRAWINGS

FIG. 4A is a pictorial illustration of a generalized embodiment of the invention, showing prefabricated contact tip structures and the interconnection elements to which they will be joined.

FIG. 4B is a cross-sectional side view of the contact tip structures of FIG. 4A joined by brazing to the interconnection elements of FIG. 4A.

DETAILED DESCRIPTION OF THE INVENTION

An apparatus and method that provides improved interconnection elements and tip structures suitable for effecting pressure connections between terminals of electronic components is described. In the following description, numerous specific details are set forth such as material types, dimensions, processing steps, etc., in order to provide a more thorough understanding of the present invention. However, it will be obvious to one of skill in the art that the invention may be practiced without these specific details. In other instances, well-known elements and processing techniques have not been shown in particular detail in order to avoid unnecessarily obscuring the present invention. Further, although the present invention is discussed with respect to use as a needle of a probe card component that provides an electrical connection between the probe card and a terminal of an electrical component under test, the present invention is not limited to use in a probe card and may be used to provide electrical connections between other electrical components under other circumstances.

Overview of Present Invention

As previously discussed, there are a number of problems associated with using the interconnection elements and tip structures currently known in the art to achieve a good electrical contact between two electronic components. The present invention addresses these problems by providing an interconnection element having a tip structure with a sharpened blade oriented on the upper surface of the tip structure such that the length of the blade runs substantially parallel (within approximately ±15° of parallel) to the direction of horizontal movement of the tip structure as the tip structure deflects across the terminal of the electronic component under test. Through use of the present invention, a reliable electrical contact is established between the electronic components. Once the tip structure contacts the terminal of the electronic component, the interconnection element forces the tip structure to deflect across the surface of the terminal such that the tip structure blade slices through (penetrates) the non-conductive layer(s) on the surface of the terminal. The electronic component may be an integrated circuit, an interconnect board, a semiconductor wafer, or a printed circuit board.

Figure 2A:
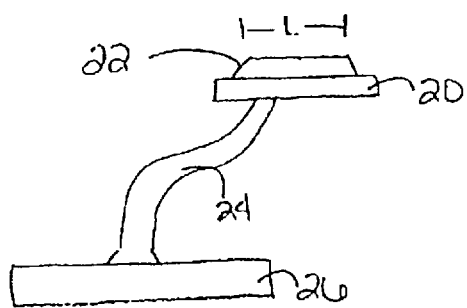
FIG. 2A is a side view of an interconnection element and tip structure of the present invention.
Figure 2B:
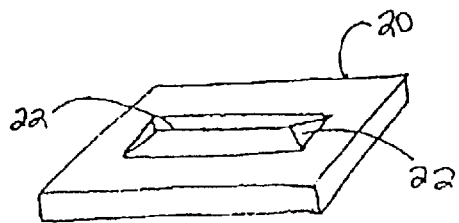
FIG. 2B is a pictorial illustration of one embodiment of a tip structure of the present invention
Figure 2C:
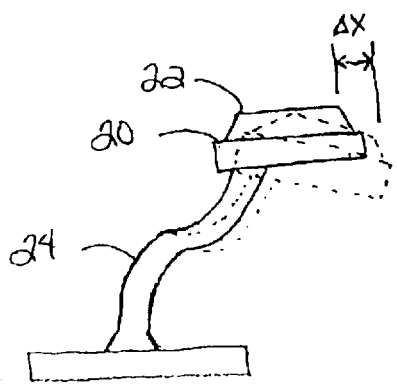
FIG. 2C is a side view showing an interconnection element and tip structure of the present invention under deflection.

FIG. 2A is a side view of the present invention, showing a spring contact element 24 coupled to a substrate 26 at one end and having a tip structure 20 coupled thereto at an opposite end. FIG. 2B is a pictorial illustration of the tip structure 20 of the present invention, having a blade 22 on the upper surface of the tip structure 20. In this embodiment of the present invention, the blade 22 comprises a contact element whose faces when extended form a line in space. When the tip structure 20 is placed in contact with a terminal of an electronic component (not shown) and a force is applied, the tip structure 20 will deflect across the surface of the terminal. As the tip structure 20 deflects across the terminal, the blade 22 of the tip structure 20 will penetrate the non-conductive layer on the surface of the terminal. FIG. 2C is a side view of the present invention. The dashed lines of FIG. 2C show the interconnection element 24 and tip structure 22 after the deflection across the terminal. ΔX represents the amount of lateral (or horizontal) deflection of the tip structure 20.

The blade 22 is oriented on the upper surface of the tip structure 20 such that the length (L) of the blade is substantially parallel to the direction of horizontal movement (ΔX) of the tip structure 20 as the tip structure 20 deflects across the surface terminal (see FIG. 2C). The orientation of the blade 22 substantially parallel to the direction of horizontal motion of the tip structure, allows the blade 22 to slice (or cut) through any non-conductive layer(s) on the surface of the terminal.

Figure 2D:
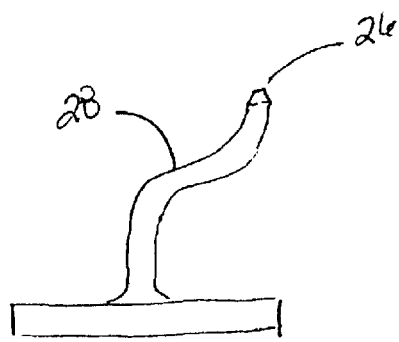
FIG. 2D is a side view of an alternative embodiment of the present invention showing an interconnection element having a substantially parallel oriented blade at one end.

FIG. 2D illustrates an alternative embodiment of the present invention, wherein the blade 26 is formed at the end of the spring contact element 28 itself, rather than being on a separate tip structure. In this manner, a substantially parallel oriented blade 26 may be formed without a transferred tip structure (such as tip structure 20 in FIG. 2A). The blade 26 may be formed at the end of spring contact 28 by several methods including but not limited to a plating or machining process (such as the use of a stamp, swage, electropolish, or electro-static discharge).

Figure 1A:
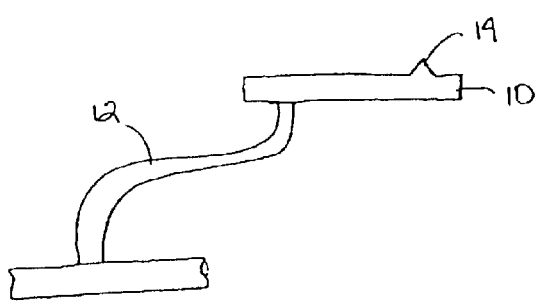
FIG. 1A is a side view of an interconnection element and tip structure known in the prior art.

The orientation of the blade 22 on the upper surface of the tip structure 20 (or the blade 26 formed at the end of spring element 28) substantially parallel to the direction of the horizontal motion component of the tip structure 20 (hereinafter generally referred to as a parallel orientation) provides numerous advantages over prior art tip structures. First, the parallel orientation of the sharpened edge along the length (L) of the blade 22 allows the blade 22 to cut cleanly through the non-conductive layer on the terminal and establish a good electrical connection with the terminal of the electric component being tested. In contrast, the substantially perpendicular orientation of the blades of prior art tip structures (i.e. when the length of the blades is oriented on the upper surface of the tip structure substantially perpendicular to the direction of the horizontal motion component of the tip structure as the tip structure deflects across the surface of the terminal under test; for example, see blade 14 of FIGS. 1A and 1B) provides a scraping motion across the non-conductive layer. The prior art blade scrapes across the terminal surface much as a bulldozer scrapes aside a layer of dirt. The scraping motion of perpendicular oriented blades may damage the surface of the terminal, often causes significant wear and tear on the blades resulting in a short life span of the blades, and often results in a buildup of stray particles and the non-conductive layers along the blade. In contrast, the parallel oriented blade 22 of the present invention circumvents each of the above-described problems by following the direction of horizontal motion component of the tip structure and cleanly slicing through the non-conductive layer on the terminal. Further, there is minimal, if any, buildup along the surface of the blade 22 which results in a lower contact resistance between the tip structure and the terminal and produces more accurate voltage levels during testing.

Figure 1B:
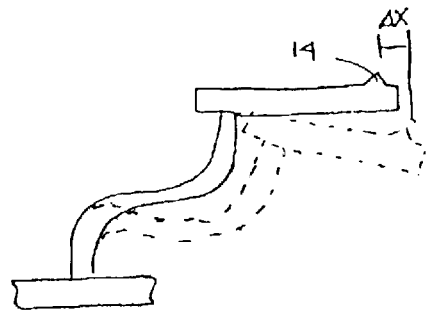
FIG. 1B is a side view of an interconnection element and tip structure, known in the prior art, under deflection.

The parallel orientation of the blade 22 also provides a more reliable electrical connection with the terminal of the electronic component under test. As electronic component terminals become smaller, any movement by the blade becomes significant as the possibility increases that any movement will move the blade outside of the terminal such that the blade will be unable to establish an electrical contact with the terminal. As shown in FIGS. 1B and 2C, the deflection of the tip structure (10, 20) across the terminal may depend on both the interconnection element's material and shape. In one embodiment, the tip structure deflects along a substantially rotational path having both a lateral (or horizontal) and a vertical component to the motion resulting in both a lateral deflection and a vertical deflection as the tip structure (10, 20) is pushed down and away from the terminal. It is possible that the perpendicularly oriented blade 14 will be pushed outside of the terminal contact area as a result of the rotational movement of the tip structure 10. In contrast, as the tip structure 20 deflects across the terminal, even if part of the blade 22 is moved outside of the terminal contact area, the remaining length of the blade 22 (the trailing end) continues to be within the terminal contact area. Likewise, even as the front end of blade 22 is forced to rotate down and away from the terminal contact area, the trailing end of the blade 22 will remain in contact with the terminal surface. In this manner, the parallel oriented blade 22 of the present invention provides a more reliable electrical connection (or interface) with the terminal of the electrical component under test.

Components of the Present Invention

The interconnection element and tip structure of the present invention may be manufactured by a variety of methods and from a variety of materials. The following methods of manufacturing and types of materials discussed are illustrative examples only and are not intended to limit the invention in any manner. Other methods and materials known in the art may also be followed and/or used.

Interconnection Element

Figure 3A:
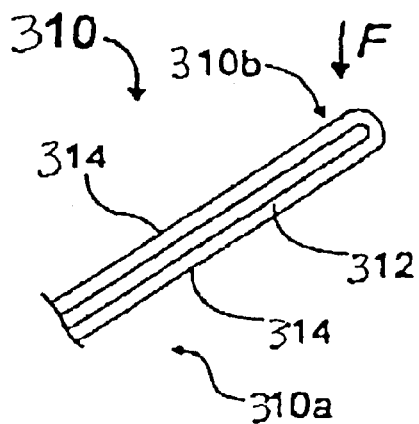
FIG. 3A is a cross-sectional view of an elongate interconnection element.
Figure 3B:
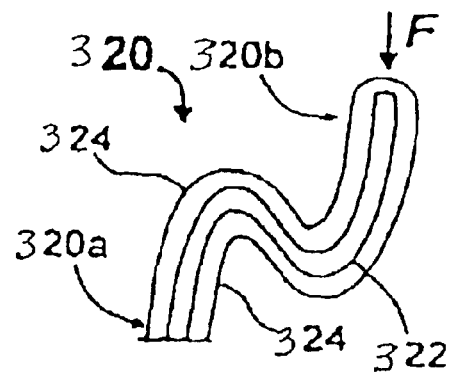
FIG. 3B is a cross-sectional view of an elongate interconnection element.
Figure 3C:
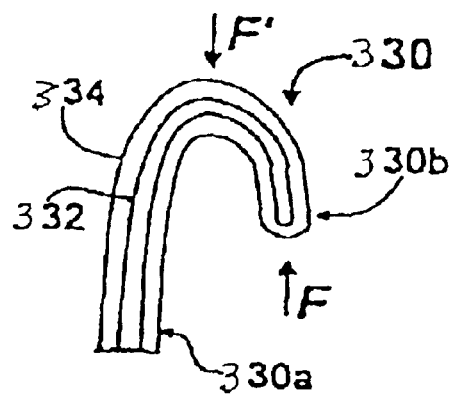
FIG. 3C is a cross-sectional view of an elongate interconnection element.

Existing interconnection elements such as elongate and/or resilient interconnection elements may be used for the interconnection element of the present invention (element 24 of FIG. 2A). When using resilient interconnection elements, a composite interconnection element is one preferred form of contact structure (spring or spring-like element). FIGS. 3A–3C illustrate various shapes commonly used for composite interconnection elements. The tip structures of the present invention may be used on any spring-like elements including those discussed herein below and those shown in U.S. Pat. No. 5,476,211, issued on Dec. 19, 1995, assigned to the assignee of the present invention, and which is incorporated herein by reference.

In FIG. 3A, an electrical interconnection element 310 includes a core 312 of a "soft" material (e.g., a material having a yield strength of less than 40,000 psi), and a shell (overcoat) 314 of a "hard" material (e.g., a material having a yield strength of greater than 80,000 psi). The core 312 is an elongate element shaped (configured) as a substantially straight cantilever beam, and may be a wire having a diameter of 0.0005–0.0030 inches. The shell 314 is applied over the already-shaped core 312 by any suitable process, such as by a suitable plating process (e.g., by electrochemical plating). It is generally preferred that the thickness of the shell (whether a single layer or a multi-layer overcoat) be thicker than the diameter of the wire being overcoated. By virtue of its "hardness", and by controlling its thickness (0.00025–0.02000 in.), the shell 314 imparts a desired resiliency to the overall interconnection element 310. In this manner, a resilient interconnection between electronic components (not shown) can be effected between the two ends 310a and 310b of the interconnection element 310.

FIG. 3A illustrates what is perhaps the simplest of spring shapes for an interconnection element of the present invention, namely, a straight cantilever beam oriented at an angle to a force as indicated by the arrow labeled "F" applied at its tip 310b. When such a contact force (pressure) is applied by a terminal of an electronic component to which the interconnection element is making a pressure contact, the downward (as viewed) deflection of the tip will result in the tip moving across the terminal, in a "wiping" motion. Such a wiping contact ensures a reliable contact being made between the interconnection element and the contacted terminal of the electronic component. The deflection (resiliency) of the interconnection element in general is determined in part by the overall shape of the interconnection element, in part by the dominant (greater) yield strength of the overcoating material (versus that of the core), and in part by the thickness of the overcoating material.

In FIG. 3B, an electrical interconnection element 320 similarly includes a soft core 322 (compare 312) and a hard shell 324 (compare 314). In this example, the core 322 is shaped to have two bends, and thus may be considered to be S-shaped. As in the example of FIG. 3A, a resilient interconnection between electronic components (not shown) can be effected between the two ends 320a and 320b of the interconnection element 320. In contacting a terminal of an electronic component, the interconnection element 320 would be subjected to a contact force (pressure), as indicated by the arrow labeled "F".

In FIG. 3C, an electrical interconnection element 330 similarly includes a soft core 332 (compare 312) and a hard shell 334 (compare 314). In this example, the core 332 is shaped to have one bend, and may be considered to be U-shaped. As in the example of FIG. 3A, a resilient interconnection between electronic components (not shown) can be effected between the two ends 330a and 330b of the interconnection element 330. In contacting a terminal of an electronic component, the interconnection element 330 could be subjected to a contact force (pressure), as indicated by the arrow labeled "F". Alternatively, the interconnection element 330 could be employed to make contact at other than its end 330b, as indicated by the arrow labeled "F".

It should be understood that the soft core can readily be formed into any springable shape—in other words, a shape that will cause a resulting interconnection element to deflect resiliently in response to a force applied at its tip. For example, the core could be formed into a conventional coil shape. However, a coil shape would not be preferred, due to the overall length of the interconnection element and inductance (and the like) associated therewith and the adverse effect of same on circuitry operating at high frequencies (speeds). Likewise, the core element need not have a round cross-section, but may rather be a flat tab ("ribbon") having a generally rectangular cross-section and extending from a sheet. Other non-circular cross-sections, such as C-shaped, I-shaped, L-shaped and T-shaped cross-sections, may also be used for the interconnection element.

The material of the shell, or at least one layer of a multi-layer shell (described hereinbelow) has a significantly higher yield strength than the material of the core. Therefore, the shell overshadows the core in establishing the mechanical characteristics (e.g., resiliency) of the resulting interconnection structure. Ratios of shell:core yield strengths are preferably at least 2:1, and may be as high as 10:1. It is also evident that the shell, or at least an outer layer of a multi-layer shell should be electrically conductive, notably in cases where the shell covers the end of the core.

Suitable materials for the core (312, 322, 332) include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony, and their alloys can be used. Generally, a wire of any material (e.g., gold) that is amenable to bonding (using temperature, pressure, and/or ultrasonic energy to effect the bonding) would be suitable for practicing the invention. It is within the scope of this invention that any material amenable to overcoating (e.g., plating), including non-metallic material, can be used for the core.

Suitable materials for the shell (314, 324, 334) include, but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum. In cases where a solder-like finish is desired, tin, lead, bismuth, indium and their alloys can also be used. The technique selected for applying these coating materials over the various core materials set forth above will, of course, vary from application-to-application. Electroplating and electroless plating are generally preferred techniques.

Another type of electrical interconnection element that may be used with the present invention is a resilient interconnection element that is formed lithographically. An oriented blade of the invention may be formed on a contact end of a lithographically formed resilient interconnection element. In one example of the invention, an oriented blade may be formed on a sacrificial substrate and then transferred to a contact end of a lithographically formed resilient interconnection element.

The interconnection elements of the present invention (element 24 of FIGS. 2A–2D) can generally be fabricated upon, or mounted to, any suitable surface of any suitable substrate, including sacrificial substrates, then either removed therefrom or mounted to terminals of electronic components.

Coupling Interconnection Elements to Tip Structures

FIG. 4A illustrates a generalized embodiment 400 of the invention wherein a plurality (four of many shown) of contact tip structures 402 have been pre-fabricated upon a support (sacrificial) substrate 404, in a manner described hereinbelow. A corresponding plurality (four of many shown) of interconnection elements 406 are shown in preparation for having their free ends 406a joined to the contact tip structures 402 (or vise-versa). The free ends 406a of the elongate interconnection elements 406 are distant (distal) from opposite ends (not shown) of the elongate interconnection elements 406 which typically would extend from a surface of an electronic component (not shown) such as a semiconductor device, a multilayer substrate, a semiconductor package, etc.

FIG. 4B illustrates, in side view, a next step of joining the contact tip structures 402 to the elongate interconnection elements 406 by brazing. A resulting braze fillet 408 is illustrated. The contact tip structures 402 are still resident on the sacrificial substrate 404 in their prescribed spatial relationship with one another. FIG. 4B is also illustrative of the contact tip structures 402 being joined to the elongate interconnection elements with conductive adhesive (e.g., silver-filled epoxy) or the like. An alternate method of joining the contact tip structures 402 to the elongate interconnection elements 406 is by overcoating at least the junction of the contact tip structures 402 and adjacent end portions of the elongate interconnection elements 406 with a metallic material such as nickel, by plating.

Figure 4C:
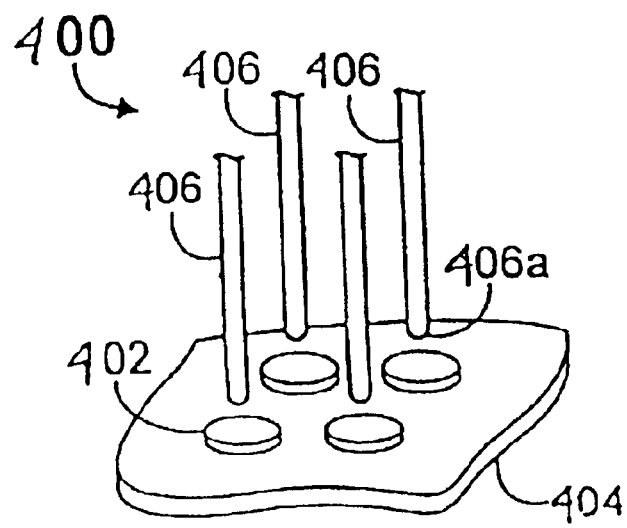
FIG. 4C is a cross-sectional side view of the contact tip structures of FIG. 4A joined by brazing to the interconnection elements of FIG. 1A, after the sacrificial substrate is removed.
Figure 4C:
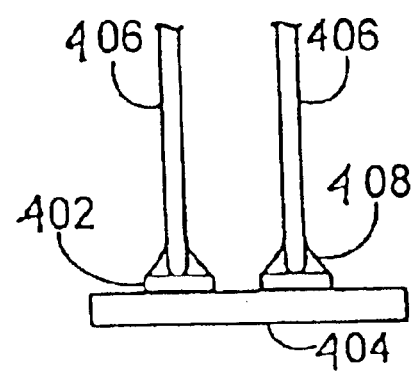
Figure 4C:
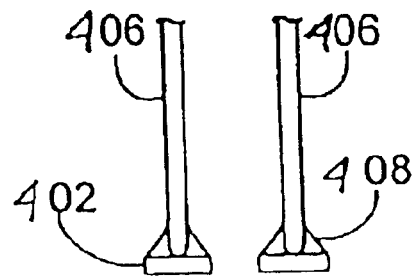

FIG. 4C illustrates, in a side view, a subsequent step, wherein, after joining the contact tip structures 402 to the elongate interconnection elements 406, the support (sacrificial) substrate 404 is removed. The resulting "tipped" interconnection element 406 (as used herein, a "tipped" interconnection element is an interconnection element which has had a separate contact tip structure joined thereto) is shown as having had a contact tip structure 402 brazed (408) thereto, in the manner described with respect to FIG. 4B.

In the embodiments described herein of forming free-standing interconnection elements (either by themselves, or upon prefabricated tip structures) on sacrificial substrates, the discussion has generally been directed to bonding an end of the interconnection element (or, in the case of a composite interconnection element, bonding an elongate core) to a sacrificial substrate. It is within the scope of this invention that instrumentalities (techniques) other than bonding can be employed.

Tip Structures

Figure 5A:
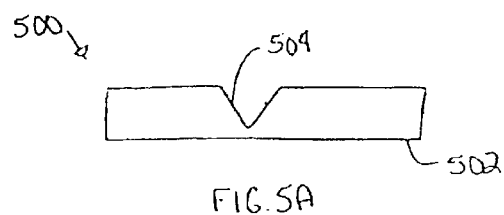
FIGS. 5A–5C are cross-sectional views of steps in a process of manufacturing cantilevered tip structures on a sacrificial substrate for interconnection elements, according to an embodiment of the invention.
Figure 5B:
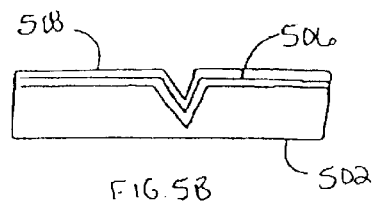
Figure 5C:
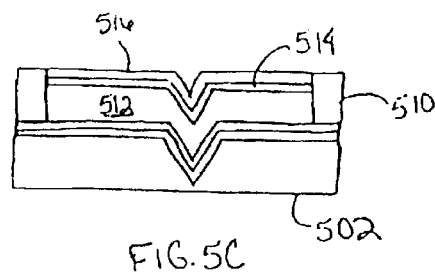
Figure 5D:
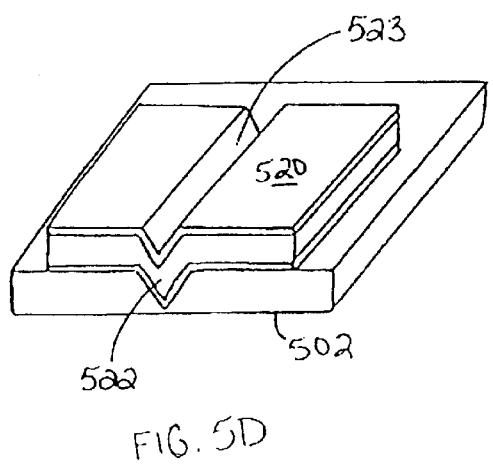
FIG. 5D is a pictorial illustration of an embodiment of a cantilevered tip structure formed on a sacrificial substrate, according to an invention.
Figure 5E:
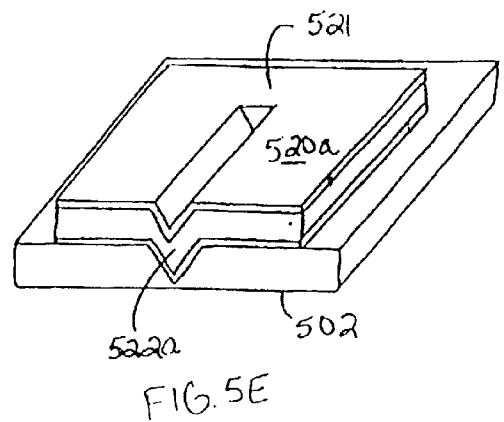
FIG. 5E is a pictorial illustration of a second embodiment of a cantilevered tip structure formed on a sacrificial substrate, according to an invention.
Figure 5F:
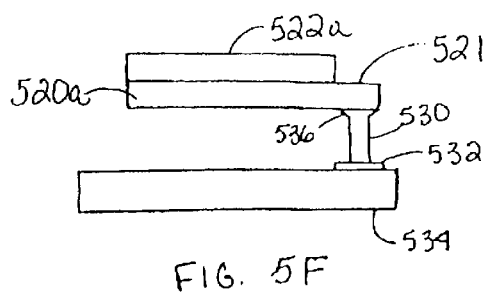
FIG. 5F is a side-view showing the cantilevered tip structure of FIG. 5E mounted to a raised interconnection element on a surface of an electronic component.
Figure 5G:
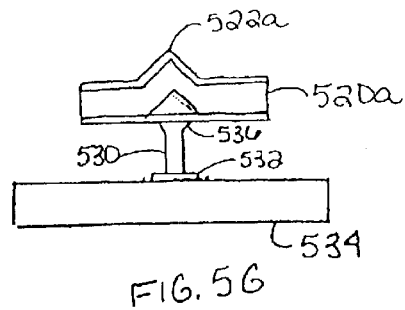
FIG. 5G is a front view of the cantilevered tip structure of FIG. 5E mounted to a raised interconnection element on a surface of an electronic component.
Figure 5H:
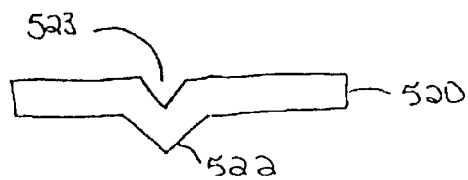
FIG. 5H is a cross-sectional view of a cantilevered tip structure as may be mounted to a raised interconnection element.
Figure 5I:
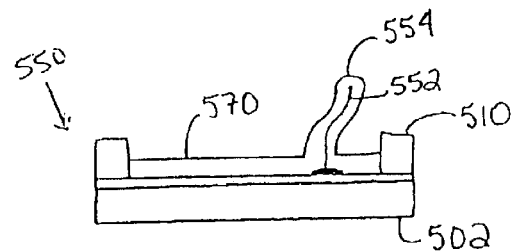
FIG. 5I is a side cross-sectional view of another embodiment of fabricating cantilevered tip structures, according to an alternate embodiment of the present invention.
Figure 5J:
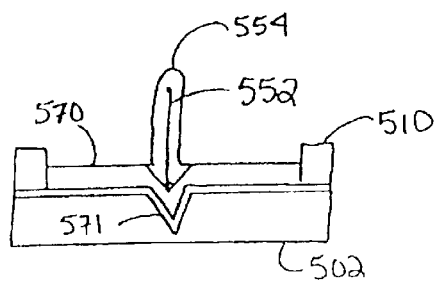
FIG. 5J is a front cross-sectional view of the embodiment illustrated in FIG. 5I.
Figure 5K:
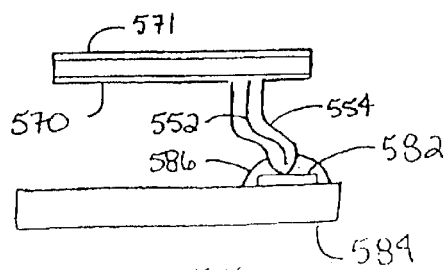
FIG. 5K is a side cross-sectional view of the cantilevered tip structure illustrated in FIGS. 5I and 5J and mounted to an electronic component, according to an alternate embodiment of the present invention.

FIGS. 5A–5H illustrate a technique 500 for fabricating tip structures having a parallel oriented blade and mounting same to interconnection elements which may serve as terminals of electronic components, and FIGS. 5I–5K illustrate an alternate technique 550 employing such tip structures. These techniques are particularly well suited to ultimately mounting freestanding interconnection elements to electronic components such as semiconductor devices, space transformer substrates of probe card assemblies, and the like.

FIG. 5A illustrates a sacrificial substrate 502, such as a wafer of monocrystalline silicon, into a surface of which a plurality (one of many shown) of trenches 504 are etched. A patterned masking layer, such as a photoresist (not shown), is first patterned on the substrate 50 to define the length and width of the trench 504. Next, the trench 504 is formed in the substrate 504. In the preferred embodiment, a potassium hydroxide (KOH) selective etch is performed between the 111 and 001 crystal orientation.

Figure 10:
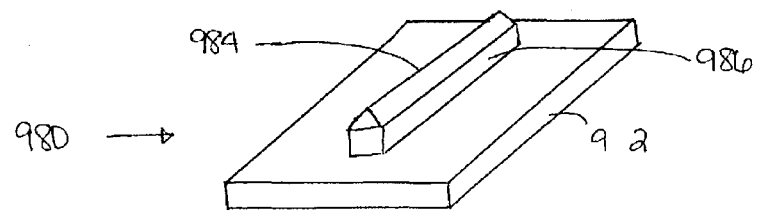
FIG. 10 is a pictorial illustration of a tip structure of the present invention having a stand-off blade.

Note that methods other than a KOH selective etch may be used to form the trench 504 used to form the blades of the present invention. For example, the trenches may also be formed with a reactive ion etch (RIE). Further, non-lithographic methods may also be employed, including but not limited to polishing (both electro-polishing and mechanical polishing) stamping, or abrading the tip structures. Combinations of straight walled and trenched structures may also be produced by combining different etching techniques. Such combinations may be desirable to create stand-off structures such as the one illustrated in FIG. 10. As with the tip structures discussed herein above, tip structure 980 is comprised of a tip base 982 and tip blade 984. Tip structure 980, however, also includes a straight-walled section 986 that provides the stand-off distance (D) for the tip structure 980.

The preferred embodiment comprises a tip structure with a blade on the upper surface, wherein the blade has a sharpened edge along the length of the blade and a triangular cross-section. However, the trenches 504 are merely illustrative of any surface texture 'template' for the tip structures which will be fabricated on the sacrificial substrate 502. The layout (spacing and arrangement) of the trenches 504 can be derived from (replicate) the bond pad layout of a semiconductor die (not shown) which is ultimately (in use) intended to be contacted (e.g., probed) by free-standing interconnection elements to which the tip structures 504 are ultimately attached. For example, the trenches 504 can be arranged in a row, single file, down the center of the sacrificial substrate. Many memory chips, for example, are fabricated with a central row of bond pads.

FIG. 5B illustrates that a hard "field" layer 506 has been deposited upon the surface of the sacrificial substrate 502, including into the trenches 504. The field layer 506 will serve as a release layer. One possible release layer is comprised of aluminum having an approximate thickness of 5000 Å. Another layer 508 can optionally be deposited over the field layer 506, if the field layer is of a material which is not amenable to plating. Typically, layer 508 is comprised of copper having an approximate thickness of 5000 Å. (If the layer 506 is difficult to remove, it may be applied by selective deposition (e.g., patterning through a mask), to avoid such removal.) After the contact structures are fabricated within the trench (see below), the sacrificial substrate 502 may be removed by any suitable process, such as by selective chemical etching.

Note also, however, that in addition to a chemical etchant, appropriate metallurgy can be used in conjunction with heat to release the sacrificial substrate 502. For example, in one embodiment of the present invention, layer 506 comprises a non-wettable material such as tungsten (or titanium tungsten) deposited on the substrate 502 by means such as sputtering. Next, the thin layer 508 is deposited comprising a non-wetting material such as plateable lead (or indium) onto the tungsten layer 506. Then, after the contact tip structures are fabricated within the trench (see below), a reflow technique (using heat) may be used to mount the contact tip structures onto interconnection elements. During reflow, the lead (material 508) will melt and ball up, since tungsten (material 506) is not wettable with respect to lead. This causes the contact tip structures to be released from the sacrificial substrate 502. Optionally, a second layer (not shown) of non-wettable material (e.g., tungsten) can be applied over layer 508, and will become part of the resulting contact tip structure unless removed (e.g., by etching). Further, another layer of material which will ball up when heated (e.g., lead, indium) can be applied over the second layer of non-wettable material (e.g., tungsten). Any residual lead on the surface of the resulting contact tip structure is readily removed, or may be left in place. Alternatively, a layer of a "barrier" material can be deposited between the second layer of material which will ball up and the first layer of the fabricated contact tip structure. The "barrier" material may be tungsten, silicon nitride, molybdenum, or the like.

Once layers 506 and 508 are deposited, a masking material 510 (illustrated in FIG. 5C), such as photoresist, is applied to define a plurality of openings for the fabrication of tip structures. The openings in the masking layer 510 define a region around the trenches 504. First, a contact metal 512 is deposited, typically having a minimum thickness of approximately 0.5 mil. This contact metal may be deposited by sputtering, CVD, PYD, or plating. In one embodiment of the present invention, the contact metal 512 is comprised of Palladium-Cobalt. Other materials may also be used for contact metal 512, including but not limited to, palladium, rhodium, tungsten-silicide, tungsten, or diamond. Next, layer 514 comprised of a spring alloy material (such as nickel and its alloys) is optionally deposited (such as by plating) to increase the bulk of the tip structure. Layer 514 typically has an approximate thickness of 0–2 mils. Over layer 514, a layer 516 is deposited comprising a material amenable to brazing or soldering, in the event that the spring alloy is not easy to bond, solder or braze to. The spring alloy layer 514 is deposited by any suitable means such as plating, sputtering, or CVD. Finally, a Au-Braze joining layer 516 is deposited. The Au-Braze layer is specific to an AuSn braze attach.

Next, as illustrated by FIGS. 5D and 5E, the masking material 510 is stripped (removed), along with that portion of the layers (506 and 508) which underlies the masking material 510, resulting in a plurality (one of many shown) of tip structures (520 and 520a) having been fabricated upon the sacrificial substrate 502. FIG. 5D shows a first embodiment of a tip structure 520 of the present invention having a blade 522 that extends the entire length of the foot of the tip structure 520. FIG. 5E shows a second embodiment of a tip structure 520a of the present invention having a blade 522a that extends along a potion of the foot of tip structure 520a. Tip structure 520a also has a back portion 521 wherein the blade 522a does not extend through the foot of the tip structure 520a. The two alternate embodiments of tip structures 520 and 520a serve the same function in providing an electrical contact with the terminal of an electronic component under test, but provide different surfaces for coupling the tip structure 520 and 520a to an interconnection element.

FIGS. 5F and 5G illustrate the mounting of the tip structures 520a shown in FIG. 5E to raised interconnection elements 530 extending (e.g., free-standing) from corresponding terminals (one of many shown) 532 of an electronic component 534. FIG. 5F shows a side view of mounted tip structures 520a and FIG. 5G shows a front view of mounted cantilever tip structures 520. The interconnection element is coupled to the foot of the tip structure 520a along the back portion 521 of the tip structure 520a where the blade 522a does not extend and the surface of the foot of the tip structure 520a is flat. The pre-fabricated tip structures 520a is mounted to the tips (top, as shown) of the interconnection elements 530, in any suitable manner such as brazing or soldering.

FIG. 5H illustrates the tip structure 520 as shown in FIG. 5D prior to being mounted to raised interconnection elements 530 extending (e.g., free-standing) from corresponding terminals (one of many shown) 532 of an electronic component 534 (interconnection elements 530, terminals 532 and electronic component 534 are not shown in FIG. 5H). In this embodiment of the present invention, the solder paste or brazing material used to mount the tip structure 520 to the interconnection element 530 is positioned within the divot 523. The end result is a mounted tip structure similar to that illustrated in FIGS. 5F and 5G, with the interconnection element affixed to the divot 523 rather than a flat back section (see 521 of FIG. 5F). Using the divot formed when fabricating the blade 522 aids in positioning the solder paste or brazing material and provides a more reliable method of forming the mechanical connection between the interconnection element 530 and the foot of the tip structure 520.

The raised interconnection elements 530 can be any free-standing interconnection elements including, but not limited to, composite interconnection elements, and specifically including contact bumps of probe membranes (in which case the electronic component 534 would be a probe membrane) and tungsten needles of conventional probe cards. The interconnection element may be formed lithographically or through a bonding and plating operation as in U.S. Pat. No. 5,476,211. The raised interconnection elements, although typically resilient and providing a spring-like motion, may also be rigid posts. Note that the shape of the resilient element to which the tip structures are attached will affect the wipe characteristic (i.e., the horizontal movement of the tip structure across the surface of the terminal contact of the device under test) in probing. External forces, such as machine-controlled movement, may also affect the wipe characteristic. Thus, the interconnection elements may be designed to optimize a desired contact behavior.

FIGS. 5I–K illustrate another technique 550 of employing tip structures, wherein the tip structures are provided with their own raised contacts (interconnection elements) prior to being mounted to terminals of an electronic component. This technique commences with the same steps of forming trenches 504 in a surface of a sacrificial substrate 502, applying a field layer 506, applying an optional brazing layer 508, and applying a masking material 510 with openings defining the locations and shapes of the resulting tip structures. Compare FIGS. 5A–5C above.

In a next step, as illustrated by FIGS. 5I–J (FIG. 5I is a side view and FIG. 5J is a front view), a freestanding interconnection element 552 is mounted to the back end portion of the tip structure 530. Then, with use of a masking layer 510, a layer of hard (springy) material 554 is deposited over the tip structure (and, optionally, another layer such as 516 which is brazeable, see above). The masking layer 510 is stripped, and the tip structure 570 can be mounted to terminals 582 of an electronic component 584, by soldering or brazing the tips of the free-standing interconnection elements 552 to terminals 582, as indicated by the solder fillet 586. Note that in the alternate mounting technique shown in FIGS. 5I–K, the coupling step (typically soldering or brazing) occurs when coupling the interconnection element to an electronic component, wherein with the first mounting technique described in FIGS. 5A–H, the coupling step joins the tip structure to the interconnection element. In other words, when contrasting the two mounting techniques, the coupling step of soldering or brazing is performed on opposite ends of the interconnection element.

In these examples, the interconnection elements 520 and 570 are illustrated as being composite interconnection elements having spring shapes, but it should clearly be understood that the invention is expressly not limited thereto. In either case (500, 550) the result is that an electronic component (534, 584) is provided with a plurality of free-standing interconnection elements (530, 552) extending from terminals thereof, the tips (free ends) of the free-standing interconnection elements 520 being provided with tip structures having a surface texture which is imparted (defined) during the process of fabricating the tip structures on the sacrificial substrate 502.

It is evident from the preceding descriptions that the interconnection elements alone (530, 552 (i.e., 552 overcoated by 554)) need not be resilient. Resilience may be provided by the ability of the cantilever tip structures (520, 570) to deflect in response to making a pressure connection with another electronic component (not shown) because the tip structures 504 are disposed along a cantilever beam. Preferably, the freestanding interconnection elements 520 are much stiffer than the cantilever beams, so that the contact force resulting from a pressure connection can be well defined and controlled.

In any cantilever beam arrangement, it is preferred that one end of the cantilever be "fixed" and the other end "movable". The cantilever beam may serve as a foot for a tip structure or a foot of a prefabricated tip structure may be mounted onto a separately fabricated beam. In this manner, bending moments are readily calculated. Hence, it is evident that the elongate interconnection elements (530, 552) are preferably as rigid as possible. (In the case where the interconnection elements (530) are contact bumps on a membrane probe, resiliency is provided by the membrane (534), itself.) However, it is not entirely inapposite that the elongate interconnection elements are implemented as composite interconnection elements, such as the composite interconnection elements discussed above, which will contribute to the overall deflection of the tip structures in response to pressure connections being made to (by) the tip structures.

Alternative Embodiments Utilizing the Present Invention

The cross-section of the tip section blade as discussed above is triangular. However, other cross-sections may also be used. For example, a truncated pyramid could easily be fabricated in a similar manner to that described above. Note also, that a tip structure initially fabricated to have a sharp edge blade along the length of the tip structure will often become flat-topped as it wears with use. This "flat-top" results in a cross-section very similar to a truncated pyramid. A tip structure having a truncated pyramid cross-section still maintains the benefits of a parallel oriented blade outlined above.

Figure 6A:
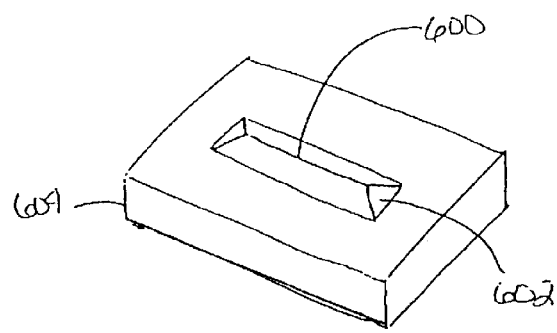
FIG. 6A is a pictorial illustration of a tip structure of the present invention having a blade having pyramidal edges.
Figure 6B:
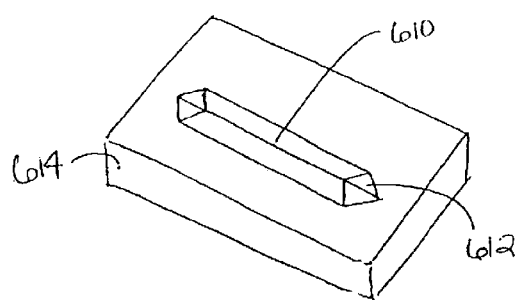
FIG. 6B is a pictorial illustration of a tip structure of the present invention having diamond shaped edges.

Different embodiments of the parallel oriented blade of the present invention may have different front and back edges. For example, in some instances, the blades may have rectilinear edges (i.e. edges that are perpendicular to the tip structure) such as the blade 522 being fabricated in FIG. 5D. FIG. 6A shows an alternate blade 600 with pyramidal front and back edges 602. On blade 600, the front and back edges 602 are at an angle larger than 90° from the foot of the tip structure 604. A second alternate blade 610 having a diamond shape is illustrated in FIG. 6B. Blade 610 is formed by performing a KOH etch at 45° relative to the primary axis of the lattice and then defining the photo resist etch widow as having 6 sides (or as having a hexagonal shape). This results in a tip structure 614 having a diamond shape blade 610 on its top surface.

Figure 7A:
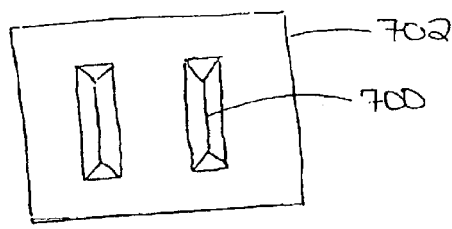
FIG. 7A is a top view of a tip structure of the present invention having two blades.

There are many other alternative embodiments that benefit from the numerous advantages provided by the parallel oriented blade of the present invention. For example, more than one blade 700 may be fabricated on a tip structure, as shown in a top view of tip structure 702 in FIG. 7A. This embodiment would be particularly useful for probing controlled collapse chip connection (C4) solder balls or other spherical structures.

Figure 7B:
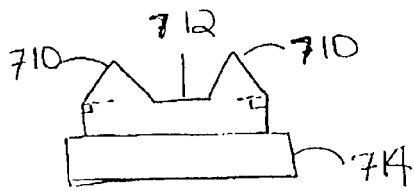
FIG. 7B is a cross-sectional view of a tip structure of the present invention having two blades joined by a bridge.

Another variation of the embodiment of the present invention having two or more blades fabricated on a single foot is shown in FIG. 7B. FIG. 7B is a front view of a tip structure 714 showing two blades 710 joined by a bridge 712, and having an included stand-off 716. Additionally, with multiple blades formed on a tip structure, the predetermined pitch between blades would be particularly useful with spherical probing having a fine pitch.

Figure 7C:
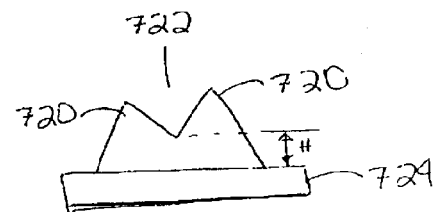
FIG. 7C is a cross-sectional view of a tip structure of the present invention having two blades in a juxtaposed position.

FIG. 7C is a side view of a third embodiment of the present invention having two or more blades fabricated on a single foot. On tip structure 724, two blades 720 are placed in a juxtaposed position and share a common trench 722 having a stand-off height of H. The juxtaposed blades 720 are particularly useful in situations for fine pitch applications with contact surfaces in close proximity.

Figure 8A:
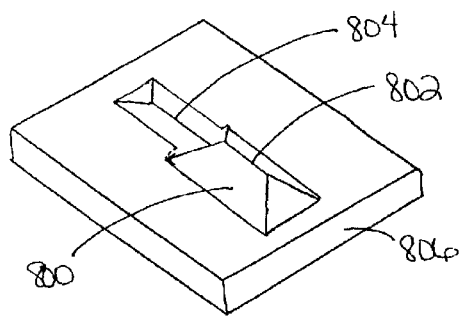
FIG. 8A is a pictorial illustration of a tip structure of the present invention having a blade with a primary blade and a trailing blade.
Figure 8B:
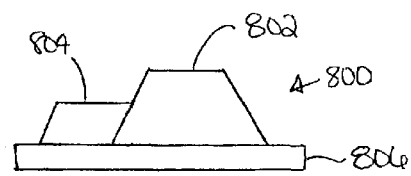
FIG. 8B is a cross-sectional view of the tip structure of FIG. 8A.

Another embodiment utilizing the present invention is a multi-height blade such as blade 800 shown in FIGS. 8A and 8B. Blade 800 has a primary blade 802 toward the front edge of the tip structure 806, and a trailing blade 804 toward the back of the tip structure 806. The blade 800 may be formed using a masking process wherein the mask surrounding the shorter, trailing blade 804 provides a smaller hole such that the trench etch by the KOH etch is shallow, and the mask surrounding the taller, front blade provides a larger hole such that the trench etch by the KOH etch is deeper and the blade 806 will be taller.

Figure 9A:
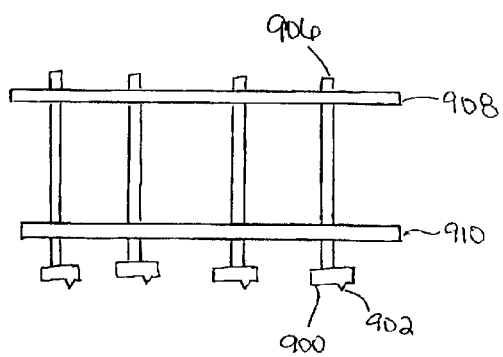
FIG. 9A is a cross-sectional view of a tip structure and substantially parallel oriented blade of the present invention affixed to Cobra style probes.

The present invention may also be used with the conventional Cobra style probes, a partial view of which is shown in FIG. 9A. Cobra style probes utilize pre-bended contact wires 906 positioned vertically and maintained by two guide plates 908 and 910. The perforated guide plates 908 and 910 hold and direct the wires 906. The Cobra style probes suffer from the restriction that the contact geometry is determined by the use of round wire, and that the contact metallurgy is that of the spring itself. Use of transferred tip structures of the present invention yield a controlled geometry, decoupling contact, and spring metallurgy. Thus, it is advantageous to affix the tip structures 900 to the ends of the contact wires 906. The guide plates 908 and 910 will then direct both the contact wires 906 and the tip structures 900 with parallel oriented blades 902 of the present invention affixed thereto across the terminals of an electronic component under test. In this manner, various embodiments of the present invention may be used in conjunction with Cobra style probes to provide a more reliable electrical connection between the Cobra style probes 906 and the terminal of the electrical component under test.

Figure 9B:
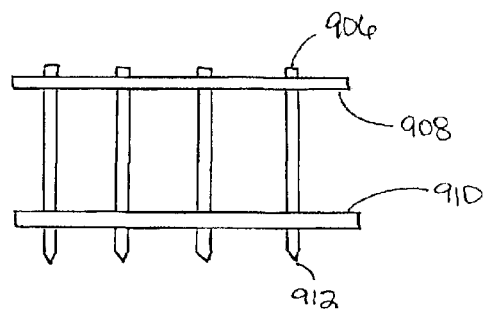
FIG. 9B is a cross-sectional view of Cobra style probes having a substantially parallel oriented blade at one end.

Alternatively, FIG. 9B illustrates another embodiment of the present invention having parallel oriented blades 912 at the ends of contact wires 906. In the same manner as described previously with respect to FIG. 2D, the blades 912 may be formed at the end of the contact wires 906 by, for example, a plating or machining process. Thus, the contact wires 906 have a blade tip or "chiseled head" 912 without the use of a transferred tip structure. Note also, that each of the alternative embodiments discussed above and below in reference to FIGS. 6A, 6B, 7A, 7B, 7C, 8A, and 8B may be modified for use with a blade (such as blade 912) formed at the end of an interconnection element that does not use a transferred tip structure.

Although the preferred embodiment of the present invention has the sharpened blade of the tip structure oriented such that the length of the blade is substantially parallel to the horizontal movement of the tip structure as the tip structure deflects across the surface of the terminal of the electronic component under test, an alternative embodiment orients the blade such that the length of the blade is positioned at a slight angle off parallel. For example, one embodiment may encompass a blade oriented at an angle such that the length of the blade is within approximately 45° of the axis parallel to the horizontal movement of the tip structure as the tip structure deflects across the surface of the terminal of the electronic component under test. Ideally, the blade(s) will be at an approximate ±30° angle to the parallel oriented axis. Thus, this embodiment is able to provide a modified scraping motion across the surface of the terminal under test while minimizing the amount of buildup accumulating along the blade 800.

Equipment for probing often includes an aligning feature. Such aligning equipment may comprise optical sensors using light beams to detect the reflection off the tip structures. Each of the above described embodiments may be further improved to include a blade design having a better reflection. More reflective blades and/or tip structures would provide a method for automatic recognition for classification and alignment purposes (e.g., alignment operations performed automatically in a wafer prober). The reflective ability of a blade is dependent on a flat upper surface at the tip of the blade (i.e. a blade having a cross-section of a truncated pyramid). The amount of reflection is controlled by controlling the length of time the initial trench (i.e. the trench used to form the blade) is etched, such that the trench does not come to a sharp point at its tip. Another method of controlling the amount of reflection per blade involves inserting reflow glass in the bottom of the trench before depositing the aluminum and copper layers. The glass at the tip of the trench softens the edge (or tip) of the blade and results in a blade having a cross-section similar to a truncated pyramid. Alternatively, the blade tips could be made having a sharpened edge in the manner described above with the sharpened edge then sanded (or grinded) down such that the blade has a flat top edge that is reflective. Both of these alternative methods of creating a reflective blade are easy to incorporate into the manufacture process Thus, an apparatus and method providing improved interconnection elements and tip structures for effecting pressure connections between terminals of electronic components is described. The sharpened blade oriented on the upper surface of the tip structure such that the length of the blade is substantially parallel to the direction of horizontal movement of the tip structure as the tip structure deflects across the terminal of an electronic component under test provides numerous advantages over the prior art. The substantially parallel oriented blade allows the tip structure of the present invention to slice cleanly through any non-conductive layers on the surface of the terminal and effect a reliable electrical contact without damaging the surface of the terminal or acquiring particle buildup along the surface of the blade. Further, the parallel orientation of the blade of the present invention maximizes contact between the tip structure and the terminal such that electrical contact is not lost as the tip structure deflects across the terminal, even with terminals having smaller contact areas.

We claim:

1. An apparatus comprising:
   a substrate;
   an interconnect element disposed on said substrate;
   a tip structure disposed at an end of said interconnect element, said tip structure comprising a blade oriented such that a length of said blade is within approximately 745 degrees of an axis parallel to a wiping motion of said tip structure.

2. The apparatus of claim 1, wherein said tip structure is integrally formed with said interconnect element.

3. The apparatus of claim 1, wherein said tip structure comprises a foot, and said blade is disposed on said foot.

4. The apparatus of claim 1, wherein said tip structure further comprises a plurality of said blades.

5. The apparatus of claim 4, wherein said plurality of blades are spaced one from another.

6. The apparatus of claim 4, wherein said tip structure further comprises a bridge disposed between a pair of said plurality of blades.

7. The apparatus of claim 4, wherein said plurality of blades comprises a primary blade and a secondary blade.

8. The apparatus of claim 7, wherein said primary blade and said secondary blade are different sizes.

9. The apparatus of claim 1, wherein said tip structure further comprises a stand off, and said blade is disposed on said stand off.

10. The apparatus of claim 1, wherein said blade is a pyramid shape.

11. The apparatus of claim 1, wherein said blade is a truncated pyramid shape.

12. The apparatus of claim 1, wherein said blade is a diamond shape.

13. The apparatus of claim 1, wherein said interconnect element comprises a wire.

14. The apparatus of claim 13, wherein said interconnect element further comprises a shell over said wire.

15. The apparatus of claim 1, wherein said interconnect element comprises a Cobra probe.

16. The apparatus of claim 1, wherein said interconnect element is resilient.

17. The apparatus of claim 1, wherein said blade comprises a sharpened edge along said length thereof.

18. The apparatus of claim 1, further comprising:
   a plurality of said interconnect elements; and
   a plurality of said tip structures.

19. The apparatus of claim 1, wherein said tip structure comprises a first material comprising at least one of palladium, cobalt, rhodium, tungsten, or diamond.

20. The apparatus of claim 19, wherein said tip structure comprises a second material comprising a spring alloy.

21. The apparatus of claim 19, said tip structure comprises a second material comprising nickel.

22. The apparatus of claim 1, wherein said tip structure is secured to said interconnect element by one of braze or solder.

* * * * *

UNITED STATES PATENT AND TRADEMARK OFFICE
CERTIFICATE OF CORRECTION

PATENT NO. : 6,825,422 B2 Page 1 of 1
APPLICATION NO. :10/174455
DATED : November 30, 2004
INVENTOR(S) : Eldridge et al.

It is certified that error appears in the above-identified patent and that said Letters Patent is hereby corrected as shown below:

Col. 15, line 27, replace "745" with --± 45--

Signed and Sealed this

Twenty-first Day of October, 2008

JON W. DUDAS
*Director of the United States Patent and Trademark Office*

(12) INTER PARTES REEXAMINATION CERTIFICATE (1063rd)
United States Patent
Eldridge et al.

(10) Number: US 6,825,422 C1
(45) Certificate Issued: Mar. 11, 2015

(54) INTERCONNECTION ELEMENT WITH CONTACT BLADE

(75) Inventors: Benjamin N. Eldridge, Danville, CA (US); Gary W. Grube, Pleasanton, CA (US); Igor Y. Khandros, Orinda, CA (US); Alec Madsen, San Francisco, CA (US); Gaetan L. Mathieu, Livermore, CA (US)

(73) Assignee: Formfactor, Inc., Livermore, CA (US)

Reexamination Request:
No. 95/000,583, Nov. 1, 2010

Reexamination Certificate for:
Patent No.: 6,825,422
Issued: Nov. 30, 2004
Appl. No.: 10/174,455
Filed: Jun. 17, 2002

Certificate of Correction issued Oct. 21, 2008

Related U.S. Application Data

(63) Continuation of application No. 09/189,761, filed on Nov. 10, 1998, now Pat. No. 6,441,315.

(51) Int. Cl.
*H01R 13/24* (2006.01)
*H01R 13/22* (2006.01)
*H01R 4/26* (2006.01)
*H01R 4/00* (2006.01)

(52) U.S. Cl.
CPC ........ *H01R 13/2407* (2013.01); *H01R 13/2442* (2013.01)
USPC ........... 174/260; 174/267; 361/772; 361/776; 439/81

(58) Field of Classification Search
None
See application file for complete search history.

(56) References Cited

To view the complete listing of prior art documents cited during the proceeding for Reexamination Control Number 95/000,583, please refer to the USPTO's public Patent Application Information Retrieval (PAIR) system under the Display References tab.

*Primary Examiner* — Sam Rimell

(57) ABSTRACT

An apparatus and method providing improved interconnection elements and tip structures for effecting pressure connections between terminals of electronic components is described. The tip structure of the present invention has a sharpened blade oriented on the upper surface of the tip structure such that the length of the blade is substantially parallel to the direction of horizontal movement of the tip structure as the tip structure deflects across the terminal of an electronic component. In this manner, the sharpened substantially parallel oriented blade slices cleanly through any non-conductive layer(s) on the surface of the terminal and provides a reliable electrical connection between the interconnection element and the terminal of the electrical component.

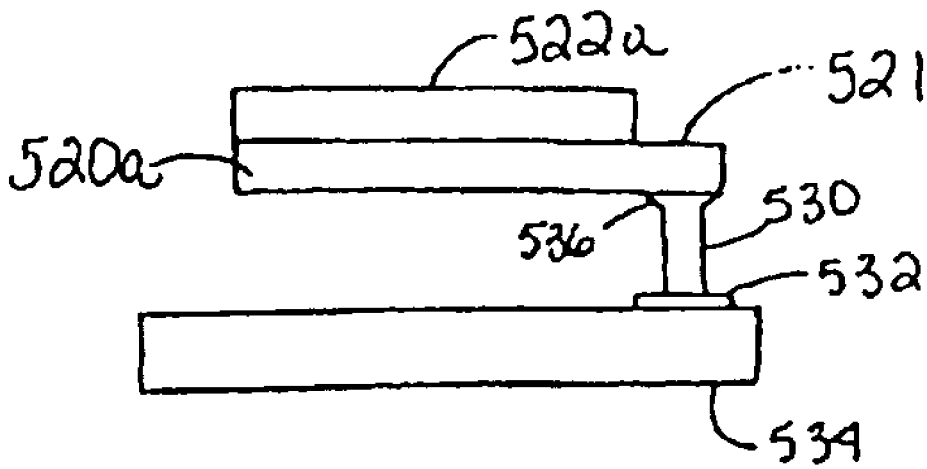

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 8 is confirmed.

Claims 1-7 and 9-22 are cancelled.

New claim 23 is added and determined to be patentable.

*23. An apparatus comprising:*
*a substrate;*
*an interconnect element disposed on said substrate;*
*a tip structure disposed at an end of said interconnect element, said tip structure comprising a blade having an elongate cutting part, wherein said blade is oriented such that a length of said cutting part is within approximately plus or minus forty-five degrees of an axis parallel to a wiping motion of said tip structure;*
*wherein said length of said cutting part is longer than a width of said cutting part;*
*wherein said tip structure further comprises a plurality of said blades;*
*wherein said plurality of blades comprises a primary blade and a secondary blade;*
*wherein said primary blade and said secondary blade are different sizes.*

\* \* \* \* \*